United States Patent
Wu et al.

(10) Patent No.: US 9,421,567 B2
(45) Date of Patent: Aug. 23, 2016

(54) RECYCLE PHOTOCHEMICAL TO REDUCE COST OF MATERIAL AND ENVIRONMENTAL IMPACT

(71) Applicants: Winston Wu, Hillsboro, OR (US); Yiming Gu, Hillsboro, OR (US)

(72) Inventors: Winston Wu, Hillsboro, OR (US); Yiming Gu, Hillsboro, OR (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 22 days.

(21) Appl. No.: 14/480,080

(22) Filed: Sep. 8, 2014

(65) Prior Publication Data
US 2016/0067729 A1  Mar. 10, 2016

(51) Int. Cl.
*B05B 15/04* (2006.01)
*H01L 21/02* (2006.01)
*H01L 21/027* (2006.01)

(52) U.S. Cl.
CPC ........ *B05B 15/0406* (2013.01); *H01L 21/0271* (2013.01); *H01L 21/02079* (2013.01); *H01L 21/02087* (2013.01); *H01L 21/02118* (2013.01)

(58) Field of Classification Search
CPC ............... H01L 21/6715; H01L 21/67075; H01L 21/6708; H01L 21/67086; H01L 21/2885; B05D 1/02; B05D 1/18; B05D 1/30; B05D 1/305
See application file for complete search history.

(56) References Cited

U.S. PATENT DOCUMENTS 6,248,169 B1 * 6/2001 Juang .................. B05B 15/0406
                                                118/319

* cited by examiner

Primary Examiner — Kyoung Lee
(74) Attorney, Agent, or Firm — Bo-In Lin

(57) ABSTRACT

This invention discloses an apparatus for coating a semiconductor wafer in a coating chamber comprising a platform for placing the semiconductor wafer thereon. The apparatus further includes a catch and recycle (C&R) apparatus comprises a rim/ring controllable to move below and surround the platform for receiving and catching a coating material spurned off in coating the semiconductor wafer.

17 Claims, 3 Drawing Sheets

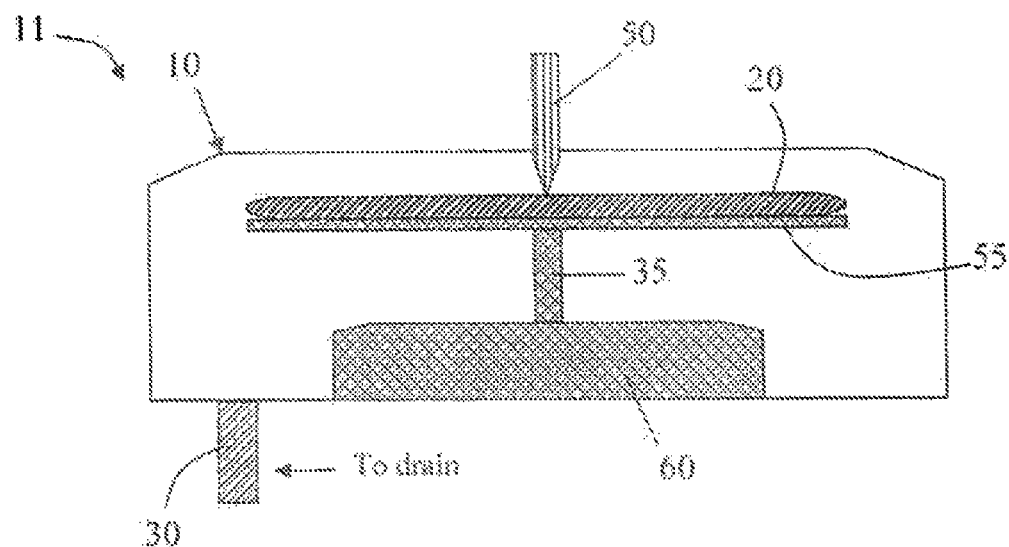
FIG. 1 – PRIOR ART
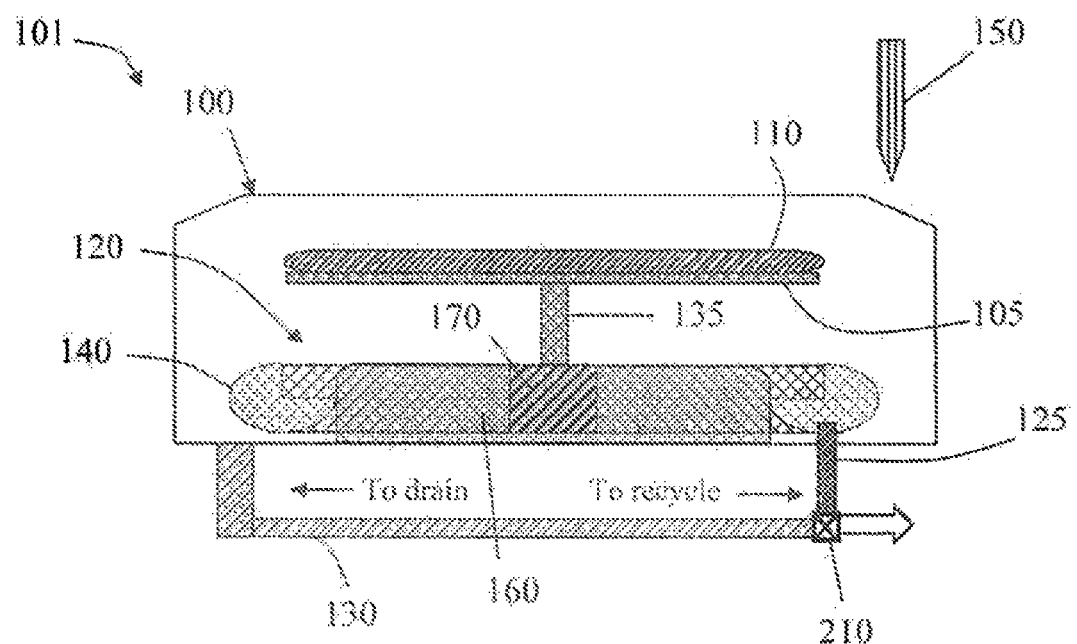
FIG. 2A

RECYCLE PHOTOCHEMICAL TO REDUCE COST OF MATERIAL AND ENVIRONMENTAL IMPACT

BACKGROUND OF THE INVENTION

1. Field of the Invention

The invention relates generally to devices and manufacture methods of electronic devices formed on the semiconductor substrate. More particularly, this invention relates to improved devices and manufacture methods to recycle the photochemical materials used in the manufacturing processes for reducing the material costs and also to minimize the environmental impacts of the manufacturing processes.

2. Description of the Relevant Art

The conventional methods and configurations for manufacturing electronic devices on semiconductor substrate are still limited by wastes of photochemical materials due to the lack of devices and processes to capture and recycle the photochemical materials as part of the manufacturing processes. Specifically, FIG. 1 shows a conventional configuration 11 to manufacturing an electronic device on a semiconductor substrate by coating a semiconductor chip with a photoresist layer followed by applying the lithographic processes to manufacture the electronic device on the semiconductor chip. As shown in FIG. 1, the device 11 includes a standard coating chamber 10, a coating platform 55 supported and rotated by a shaft 35 and a drive mechanism 60 located inside the coating chamber 10. The device 11 also includes a drain system 30 disposed at the bottom of the coating chamber 10 and a dispense nozzle 50 located at the top of the coating chamber 10 for dispensing the coating material, for example photochemical materials, on the wafer in the coating process. In the coating process, a wafer 20 is placed on a coating platform 55; hence the dispense nozzle 50 is moved to the center of the wafer 20 and deposits the coating material, for example the photoressist, on the wafer while a drive mechanism 60 supports and rotates the coating platform 55 with the wafer 20. As such, the coating material is uniformly coated on the top surface of the wafer. The residual coating material spun off from the wafer 20 is drained out at the drain system 30. In the conventional coating process, more than 99% of the coating material is wasted since the coating material is not separately collected and recycled and is just drained as wastes. The waste of the photochemical materials incurs not only the cost of the material, but also cost of collection and treatment thus causes potential hazardous environmental impacts.

Therefore, a need still exists to provide new device configurations and manufacture methods for applying the photochemical materials for manufacturing the electronic devices on a semiconductor substrate such that the above discussed problems and limitations can be resolved.

SUMMARY OF THE PRESENT INVENTION

It is therefore an aspect of the present invention to provide an improved device configuration and manufacture processes to capture and reuse 99% of the drained and wasted Photoresist spun off the wafer during conventional coat process. It is a further aspect of this invention that a successful implementation can achieve a cost reduction of Photo-chemical, resist, Polyimide, etc., by 99% and can minimize the environmental impacts caused by the wastes of the photochemical materials.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1 shows a conventional manufacturing device configuration for coating a semiconductor chips to carry out the photolithographic processes.

FIGS. 2A to 2C are improved manufacturing device configurations of this invention for implementing the processes of coating a semiconductor chips to carry out the photolithographic processes.

DETAILED DESCRIPTION OF THE METHOD

Figure 2B:
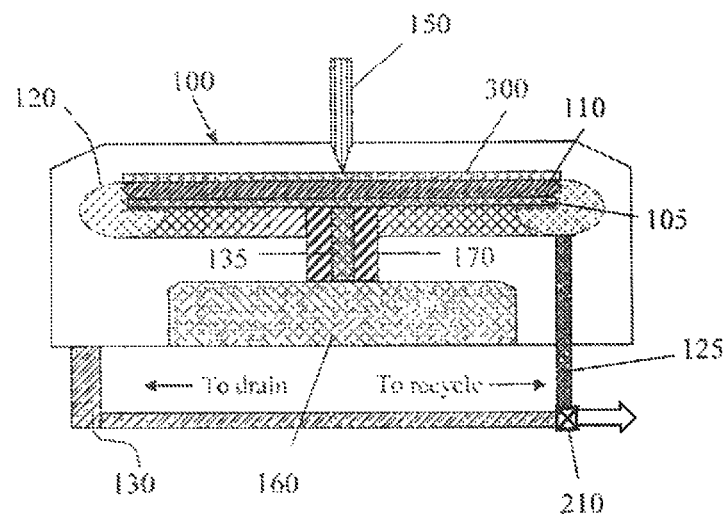
Figure 2C:
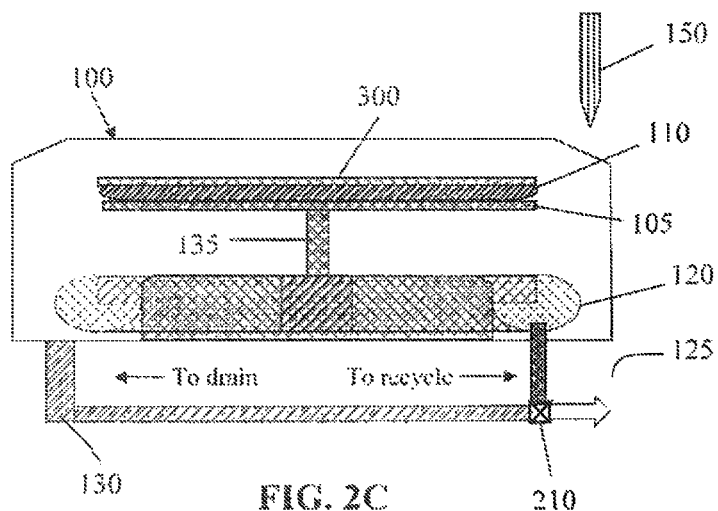

Referring to FIGS. 2A to 2C as a series of side cross sectional views for illustrating the improved manufacturing device configurations and processing steps for carrying out a chip coating process. As shown in FIG. 2A, the device 101 includes a coating chamber 100, a coating platform 105 supported and rotated by a shaft 135 and a drive mechanism 160 located inside the coating chamber 100. The device 101 also includes a dispense nozzle 150 located at the top of the coating chamber 100 for dispensing the coating material, for example photochemical materials, on the wafer in the coating process. Different from the device 11 of FIG. 1, the device 101 of the present invention also include a catch and recycle (C&R) apparatus 120, which includes a rim/ring 140 mounted on a second shaft 170, or a control arm, and surrounding the coating platform 105, a drain system 130 and a recycle system 125 disposed on the bottom of the coating chamber 100 at two opposite sides of the C&R apparatus 120, where rim/ring 140 is connected to the recycle system 125, and a two way valve 210 connected to the drain system 130 add the recycle system 125 programmable to open/close depending on the need to drain or recycle. The second shaft 170 of the catch and recycle (C&R) apparatus 120 is used for raising up the rim/ring 140 during the coating process. In an exemplary embodiment, the C&R rim/ring 140 is made of compatible material as standard coat chamber 100 and has a diameter of approximate one inch.

As shown in FIG. 2A, at the beginning of the coating process, the catch and recycle (C&R) apparatus 120 is in a lower position while a wafer 110 is placed on a coating platform 105 in the coating chamber 100.

As shown in FIG. 2B, the C&R apparatus 120 is raised up, where the rim/ring 140 is raised up by the second shaft 170 and thus surrounds the coating platform 105 during a coating process. The dispense nozzle 150 is moved to the center of the wafer 110 and dispenses a coating material on the wafer while the coating platform drive mechanism 160 supports and rotates the coating platform 105 with the vertical supporting shaft 135, as such forming an uniform coating layer 300 on the wafer 110. During the coating process, the residual coating material is spun off from the wafer and thus is collected into the rim/ring 140 surrounding the coating platform 105. The collected residual photochemical materials in the rim/ring 140 is then flowed out of the coating chamber 100 through the recycle system 125 and then enter into a recycle container as that further shown in FIG. 3 for a treatment before returning back to the coating chamber 110 for the next coating process. In this step, the coat recipe/program will have the two-way valve open to recycle.

After the coating process is completed, as shown in FIG. 2C, the dispense nozzle 150 is moved away and the C&R apparatus 120, also the rim/ring 140, is lowered followed by an edge solvent cleaning process, where the cleaning solvent is dispensed on the edge and sides of the wafer for edge bead removal after photoresist deposition. The cleaning solvent with the photochemical materials are then washed off from the wafer and drained out of the coating chamber 100 through a drain system 130. In this step, the capture rim/ring 140 is capable of self-cleaning with the cleaning solvent or in situ clean with a solvent vapor to ensure contamination free at preset interval. In addition, the temperature is controlled during the coating process for chemical consistency of the recycled photochemical materials.

In this invention, the C&R rim/ring 140 is mounted on the second shaft 170; therefore the C&R rim/ring 140 is capable of photoresist capture in the upper position during the coating step, and can avoid the edge bead removal during the clean process in the lower position. In this step, the coat recipe/program will have the two-way valve open to drain.

Figure 3:
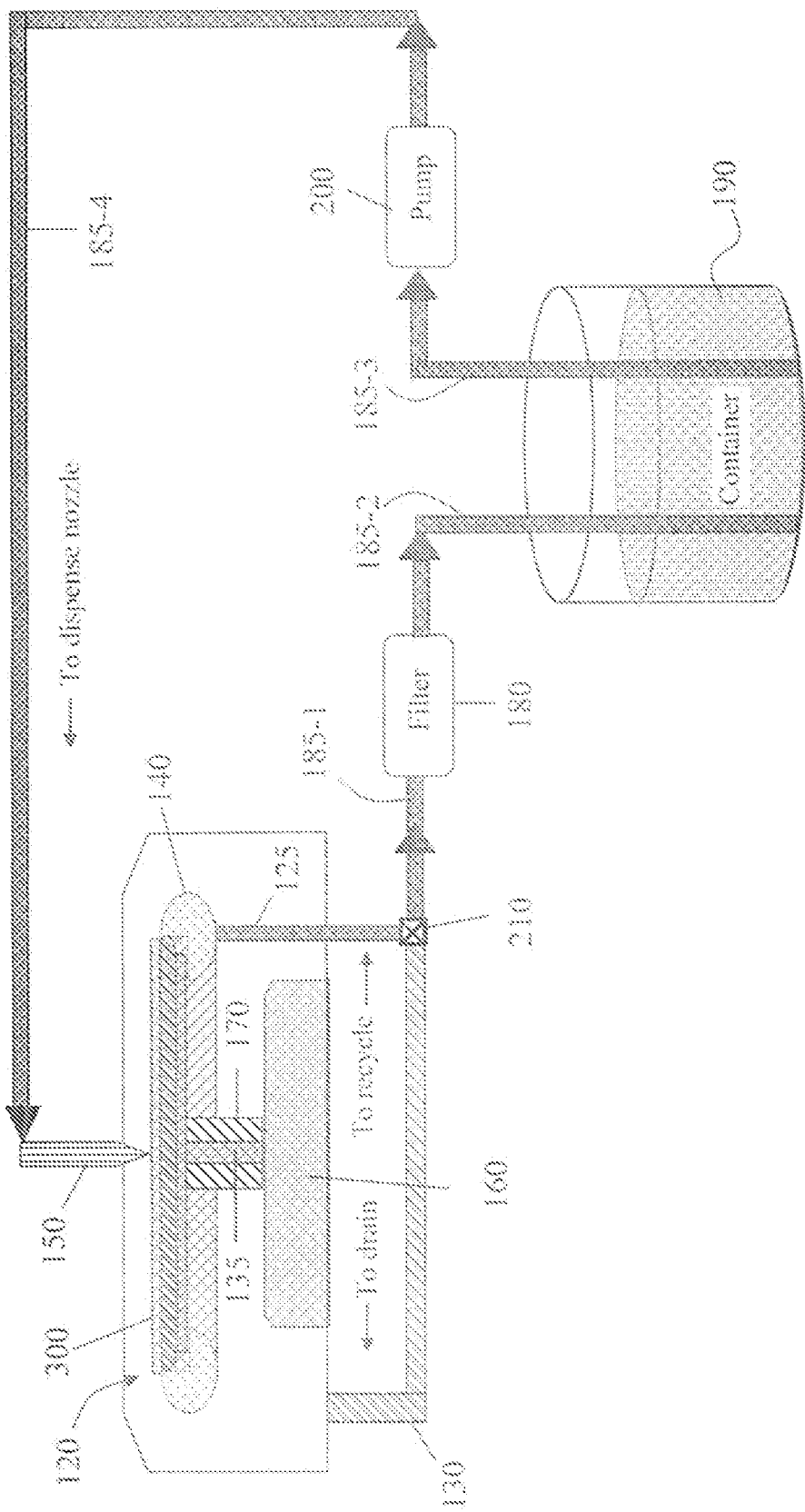
FIG. 3 is a diagram for illustrating additional details of the improved manufacturing device configuration of this invention to capture and recycle the photochemical materials.

FIG. 3 is a diagram to show further details of the C&R apparatus 120 of this invention. The recycle photochemical materials collected in the rim/ring 140 of the C&R apparatus 120 is flowed out of the coating chamber 100 via the two way valve 210, through the recycle system 125 and then to a filter 180 through a duct 185-1. The filter 180 is provided to separate impurity and containments that may get into the photochemical materials during the coating processes, as such the recycle photochemical materials are filtered to remove small particles or mixed impurities during the coating processes. The filtered photochemical materials are flowed through a duct 185-2 to a recycle container 190 and ready to be further applied for a coating process. The filtered photochemical materials stored in the container 190 is then flowed to a pump 200 through a duct 185-3, from where they are pumped to the dispense nozzle 150 through a duct 185-4 for a new coating process. The filtered photochemical material is stored in the container 190, for example a special photoresist (PR) bottle, that may be monitored for viscosity and photo-speed consistency with optimized environmental and contamination controls. The container 190 and the pump 200 can be setup with as standard equipment.

Specifically, by implementing the C&R apparatus of this invention as described above, the cost savings of 99% may be achieved. A simple cost analysis is provided as the followings:

Cost Analysis:
Volume of Photoresist in one Gallon Bottle: 3785 cc
Volume of Photoresist Dispensed on a wafer ~2.00 cc
Volume of Photoresist Coated on a Wafer:

$$V=PR\text{thickness}*\pi r^2=(0.5um)*3.16*100cm^2=0.016\ cc$$

Therefore,
Number of Coated Wafer w/o Recycle per Bottle=1,893
Number of Coated Wafers with 99% Recycle=189,102

According to above analyses, one bottle of the chemical can run 99.9 times more wafers; or, the cost of chemical (PR/Polyimide) and its waste treatment are reduced by 99%. The photochemical materials recycled by applying the C&R apparatus 120 of the present invention may include photosensitive chemical such as photoresist, polyimide, etc.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An apparatus for coating a semiconductor wafer in a coating chamber comprising a platform for placing the semiconductor wafer thereon, further comprising:
   a catch and recycle (C&R) apparatus comprises a rim/ring that is controllable to move below and surround the platform for receiving and catching a coating material spun off from the semiconductor wafer in a coating process of the semiconductor wafer; and
   the C&R apparatus further comprises a first duct with a filter connected to a recycle system on a first end of the duct and connected to a recycle container on a second end opposite the first end of the duct for flowing the coating materials from the recycle system through the duct and filter to the container.

2. The apparatus for coating a semiconductor wafer of claim 1 further comprising:
   a dispense nozzle for spreading the coating material on a top surface of the semiconductor wafer disposed on the platform.

3. The apparatus for coating a semiconductor wafer of claim 1 wherein:
   the C&R apparatus further comprises a drain system, the recycle system is connected to the rim/ring, the recycle system and the drain system are disposed on two different sides of the C&R apparatus.

4. The apparatus for coating a semiconductor wafer of claim 1 further comprising:
   a driving mechanism for driving and rotating the platform during coating the semiconductor wafer.

5. The apparatus for coating a semiconductor wafer of claim 1 wherein:
   the C&R apparatus further comprises a control arm for controlling and moving the rim/ring to different locations.

6. The apparatus for coating a semiconductor wafer of claim 1 wherein:
   the C&R apparatus further comprises a second duct connected between the recycle container and a dispense nozzle through a pump for pumping the filtered coating materials from the recycle container to the dispense nozzle.

7. The apparatus for coating a semiconductor wafer of claim 6 wherein:
   the drain system further comprises a third duct connected to a drain container for draining processed coating materials and a cleaning solvent out of the coating chamber.

8. The apparatus for coating a semiconductor wafer of claim 3 wherein:
   the C&R apparatus further comprises a two way valve controller for controlling and selective opening to the recycle system or the drain system.

9. A method for manufacturing a device on a semiconductor substrate by coating a photochemical material on a surface of the semiconductor substrate, wherein the method further comprising:
   catching the photochemical material into a recycle container during a coating process spun off from the surface of the semiconductor substrate as a recyclable unprocessed photochemical material before further processes are performed on the photochemical material; and
   the step of catching the recyclable unprocessed photochemical material into a recycle container further comprising a step of raising a rim/ring to dispose underneath and surrounding a coating platform to catch the recyclable unprocessed photochemical material during the coating process.

10. The method of claim 9 wherein:
the step of raising the rim/ring to dispose underneath and surrounding the coating platform further comprising a step of raising the rim/ ring with a first shaft and then coating the semiconductor substrate by rotating the coating platform with a second shaft.

11. A method for manufacturing a device on a semiconductor substrate by coating a photochemical material on a surface of the semiconductor substrate, wherein the method further comprising:
catching the photochemical material into a recycle container during a coating process spun off from the surface of the semiconductor substrate as a recyclable unprocessed photochemical material before further processes are performed on the photochemical material; and
the step of catching the recyclable unprocessed photochemical material into a recycle container further comprising a step of connecting a first duct with a filter to the rim/ring for conducting and filtering the recyclable unprocessed photochemical material spun off during the coating process into the recycle container.

12. A method for manufacturing a device on a semiconductor substrate by coating a photochemical material on a surface of the semiconductor substrate, wherein the method further comprising:
catching the photochemical material into a recycle container during a coating process spun off from the surface of the semiconductor substrate as a recyclable unprocessed photochemical material before further processes are performed on the photochemical material; and
recycling the recyclable unprocessed photochemical material by connecting a second duct with a pump from the recycle container to a coating material dispenser for pumping the recyclable unprocessed photochemical material from the recycle container to the dispenser during the coating process.

13. A method for manufacturing a device on a semiconductor substrate by coating a photochemical material on a surface of the semiconductor substrate, wherein the method further comprising:
catching the photochemical material into a recycle container during a coating process spun off from the surface of the semiconductor substrate as a recyclable unprocessed photochemical material before further processes are performed on the photochemical material; and
performing a photochemical process on the photochemical material coated onto the surface of the semiconductor substrate followed by controlling the rim/ring to move lower from the coating platform followed by applying a cleaning solvent on edges and sides of the semiconductor substrate then washing off and cleaning the rim/ring before draining out to a drain system.

14. The method of claim 13 wherein:
the step of washing off and cleaning the rim/ring before draining out to a drain system further comprising a step of controlling a two-way valve to shut a duct connecting from the rim/ring to the recycle container and opening to a drain duct connecting from the rim/ring to a drain container.

15. The method of claim 13 further comprising:
controlling a dispenser for dispensing the photochemical material to move away from the coating platform before performing the photochemical process on the photochemical material coated onto the surface of the semiconductor substrate.

16. A method for manufacturing a device on a semiconductor substrate by coating a photochemical material on a surface of the semiconductor substrate, wherein the method further comprising:
catching the photochemical material into a recycle container during a coating process spun off from the surface of the semiconductor substrate as a recyclable unprocessed photochemical material before further processes are performed on the photochemical material; and
controlling a dispenser in a coating chamber to move above the semiconductor substrate before the coating process followed by raising the rim/ring to dispose underneath and surrounding the coating platform to rotating the coating platform and to dispense the photochemical material on the surface of the semiconductor substrate.

17. A method for manufacturing a device on a semiconductor substrate by coating a photochemical material on a surface of the semiconductor substrate, wherein the method further comprising:
catching the photochemical material into a recycle container during a coating process spun off from the surface of the semiconductor substrate as a recyclable unprocessed photochemical material before further processes are performed on the photochemical material; and
the step of catching the recyclable unprocessed photochemical material into a recycle container further comprising a step of catching the recyclable unprocessed photochemical material into a special photoresist (PR) bottle.

\* \* \* \* \*